United States Patent [19]

Seo et al.

[11] Patent Number: 5,532,620
[45] Date of Patent: Jul. 2, 1996

[54] INPUT BUFFER CIRCUIT CAPABLE OF CORRESPONDING TO VARIATION OF OPERATING VOLTAGE IN SEMICONDUCTOR INTEGRATED CIRCUIT

[75] Inventors: Bo-Sung Seo, Suwon; Jong-Young Kim, Seoul, both of Rep. of Korea

[73] Assignee: Samsung Electronics Co., Ltd., Suwon, Rep. of Korea

[21] Appl. No.: 359,458

[22] Filed: Dec. 19, 1994

[30] Foreign Application Priority Data

Dec. 18, 1993 [KR] Rep. of Korea .................. 1993-28378

[51] Int. Cl.[6] ...................... H03K 19/0175; H03K 19/01
[52] U.S. Cl. ............................... 326/81; 326/17; 326/71; 326/87
[58] Field of Search ................................ 326/80, 81, 71, 326/83, 87, 17; 327/530

[56] References Cited

U.S. PATENT DOCUMENTS

| | | |
|---|---|---|
| 4,965,469 | 10/1990 | Kondoh et al. ............................ 326/81 |
| 5,343,086 | 8/1994 | Fung et al. ............................... 327/530 |
| 5,418,476 | 5/1995 | Strauss .................................... 326/81 |

OTHER PUBLICATIONS

"Variable Vcc Design Techniques for Battery Operated DRAMs", 1992 Symposium on VLSI Circuits, pp. 110–111.

*Primary Examiner*—Edward P. Westin
*Assistant Examiner*—Richard Roseen
*Attorney, Agent, or Firm*—Cushman Darby & Cushman

[57] ABSTRACT

An input buffer circuit for converting a TTL(TTL:Transistor transistor logic) level signal supplied from an outside into an internal CMOS level signal. The input buffer circuit comprises a power voltage terminal supplied with a power voltage, a power voltage sensing signal generator for detecting a level of the power voltage by inputting as source power the power voltage supplied to the power voltage terminal and for outputting a power voltage sensing signal respondent to the detected level, and switching means for convening an external signal into an internal signal and for performing an switching operation in response to a level of the power voltage sensing signal positioned on an output path to output the convened signal.

17 Claims, 5 Drawing Sheets

5,532,620

INPUT BUFFER CIRCUIT CAPABLE OF CORRESPONDING TO VARIATION OF OPERATING VOLTAGE IN SEMICONDUCTOR INTEGRATED CIRCUIT

BACKGROUND OF THE INVENTION

The present invention relates to a semiconductor integrated circuit, and more particularly to an input buffer circuit for converting a TTL(TTL:Transistor transistor logic) level signal supplied from an outside into an internal CMOS level signal.

As a semiconductor integrated circuit, a semiconductor memory device is activated from signals such as an address, a control signal or data supplied from a system and then performs corresponding operation like read or write operation. The levels of the signals input from the system are generally converted into the TTL level. In order for CMOS circuit of the internal of a chip to perform the corresponding operate, there should be a circuit to convert the TTL level into the CMOS level like the input buffer. Meanwhile, such an input buffer is connected to a PIN or a PAD on the same chip and then shapes the address, the control signal or the data input through the PIN or the PAD.

In typical, since the semiconductor memory device uses an operating voltage of 5 volts or 3.3 volts, the input buffer exclusively used in the 5 volts or the input buffer exclusively used in 3.3 volts is actually restricted by a kind of system. Therefore, the input buffer should be designed to adapted to all the systems employing the 5 volts or 3.3 volts. Further, even if the operating voltage is varied, the input buffer should maintain its original characteristic of shaping input signals, and also should be stably driven.

FIG. 1 shows an input buffer circuit capable of corresponding to the variation of an operating voltage. In the construction, the input buffer circuit shown in FIG. 1 further comprises, in addition to a PMOS transistor 4 having one inverter which inputs an external signal Vin and an NMOS transistor 8, a PMOS transistor 10 having the other inverter stable to the operating voltage of 3.3 volts and an NMOS transistor 12. Therefore, the input buffer circuit of FIG. 1 is to implement a double use of the operating voltages of 5 volts and 3.3 volts. Meanwhile, in FIG. 1, a mask indicated by a dotted line block is used as one option and whose change is determined according to the operating voltage. For example, in case that a power voltage Vcc becomes 5 volts, the voltage level of the power voltage Vcc charged to an outputting node 6 is enough high. Thereby, the input buffer can be operated by only the PMOS transistor 4 and the NMOS transistor 8. However, in case that the power voltage Vcc becomes 3.3 volts, the PMOS transistor 4 requires much time to charge the voltage level of the power voltage Vcc charged to the outputting node 6. Thereby, input "high" characteristic VIH becomes bad and it is difficult to perform an access operation at high speed. Accordingly, the PMOS transistor 10 and the NMOS transistor 12 should be further included. Consequently, when the input buffer shown in FIG. 1 is employed in the system of 3.3 volts, the mask maintaining the dotted line block should be used, whereas when the input buffer is employed in the system of 5 volts, the other mask disconnecting the dotted line block should be used. Therefore, a company producing the chip must change the design thereof according to the operating voltage of the system. Further, the company has a large load of adding the mask. As known to one skilled in the art, it is clear that an additional use of the mask has a serious influence on production cost and production time. Meanwhile, in FIG. 1, there aries an inconvenience in that the mask should be used as two stages in order to apply the circuit to all the systems of 5 volts and 3.3 volts.

SUMMARY OF THE INVENTION

It is therefore object of the present invention to provide an input buffer circuit capable of corresponding to the variation of an operating voltage.

It is another object of the present invention to provide an input buffer circuit in which it is unnecessary to change a mask, even if an operating voltage is varied.

It is still another object of the present invention to provide an input buffer circuit capable of reducing a producing process because it is unnecessary to change a mask, even if, an operating voltage is varied.

It is further object of the present invention to provide an input buffer circuit capable of corresponding to a plurality of operating voltages by using a single mask and thus of reducing production cost and production time.

The present invention according to the above objects is to provide the semiconductor integrated circuit having the input buffer circuit capable of corresponding to all the systems having operating voltages of 5 volts and 3.3 volts.

The input buffer circuit according to the present invention has a driving transistor whose switching operation is determined according to the voltage level of the power voltage.

The driving transistor according to the present invention is controlled by the power voltage sensing signal to sense the voltage level of the power voltage.

The power voltage sensing signal is outputted from a power voltage sensing signal generator which determines the logic of its output signal according to the voltage level of the power voltage corresponding to the voltage level of a predetermined reference voltage.

BRIEF DESCRIPTION OF THE DRAWINGS

The above and other objects, advantages and features of the present invention will be more apparent from the following detailed description taken with the attached drawings in which.

DETAILED DESCRIPTION OF THE PREFERRED EMBODIMENT

In the following description, a plurality of input buffer circuits are set forth to provide a more thorough understanding of the present invention. It will be apparent, however, to one skilled in the art, that the present invention may be practiced without a plurality of input buffer circuits.

In the embodiments of the input buffer circuits shown in FIGS. 2 to 8, only the power voltage sensing signal is supplied as a control signal to the input buffer circuit formed between the power voltage Vcc and the ground voltage Vss. Further, with respect to the logic operations of the input buffer circuits, reverse logic circuits to input signals, i.e., inverter circuits, are implemented.

Figure 1:
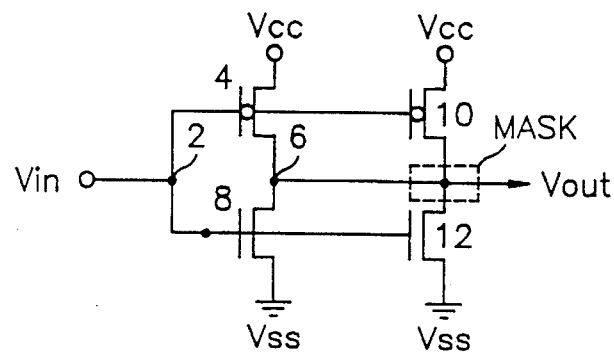
FIG. 1 is a circuit view showing an input buffer circuit according to the conventional art.
Figure 2:
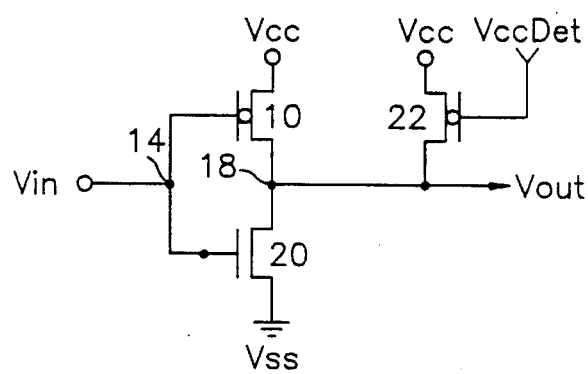
FIG. 2 is a circuit view showing a first embodiment of an input buffet circuit according to the present invention.

FIG. 2 is circuit view showing the first embodiment of the input buffer circuit according to the present invention. In FIG. 2, the constructions of a PMOS transistor 16 and an NMOS transistor 20 are the same as those of FIG. 1. The input buffer circuit is comprised of the PMOS transistor 16 control-inputting an input signal Vin supplied from an outside and having a current path formed between the power voltage Vcc and an output node 18, the PMOS transistor 16 being a first pull-up transistor; the NMOS transistor 20 control-inputting the input signal Vin and having the current path formed between the ground voltage Vss and the output node 18, the NMOS transistor 20 being a pull down transistor; and a PMOS transistor 22 control-inputting the power voltage sensing signal VccDet whose logic level is determined according to a kind of operating voltage and having the current path formed between the power voltage Vcc and the output node 18, the PMOS transistor 22 being a second pull-up transistor. The PMOS transistor 22 comprised newly in the construction of FIG. 2 gate-inputs the power voltage sensing signal VccDet and functions as the driving transistor whose switching operation is determined according to the voltage level of the power voltage. As a signal detecting the voltage level of the power voltage, the power voltage sensing signal VccDet is maintained at the logic "low" level in case that the power voltage Vcc is 3.3. volts, whereas it maintained at the logic "high" level in case the power voltage is 5 volts. Therefore, if the power voltage Vcc becomes 3.3 volts, the PMOS transistor 22 is turned on and thus charges at high speeds the level of the power voltage Vcc charged to the output node 18. Also, if the power voltage Vcc becomes 5 volts, the PMOS transistor 22 is turned off and thus, the level of the power voltage Vcc charged to the output node 18 can be adjusted by only the PMOS transistor 16. Meanwhile, FIG. 2 is constructed to output the reverse signal in response to the input of the input signal Vin to be an external signal. In such an output operation, the logic of the output signal is determined according to the logic of a circuit which includes the inverter in the output node 18 or is supplied with a signal Vout. Therefore, according to the input buffer circuit like FIG. 2, there is no need to separately use the mask pursuant to the operating voltage.

Figure 3:
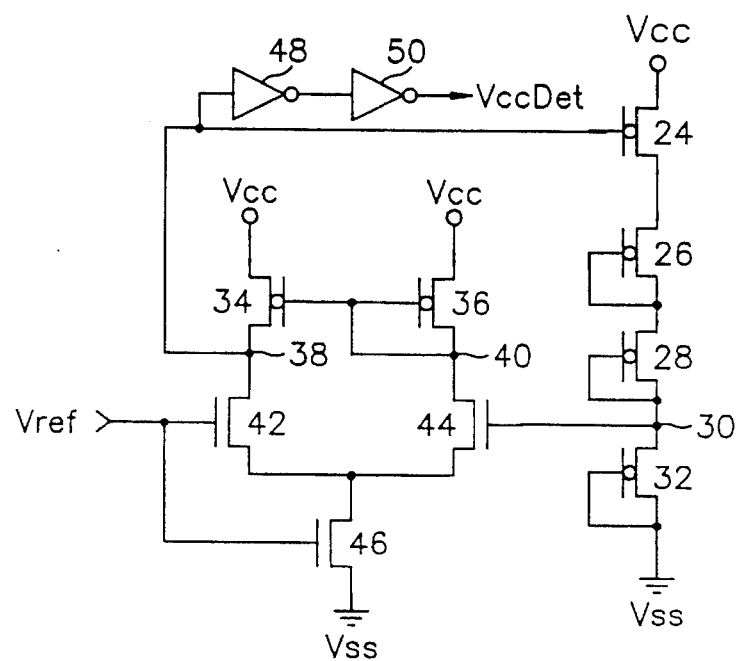
FIG. 3 is a circuit view showing an embodiment of a power voltage sensing signal generator for generating a power voltage detecting signal VccDet of FIG. 2.

FIG. 3 is a circuit view showing the embodiment of the power voltage sensing signal generator for outputting the power voltage sensing signal VccDet of FIG. 2. In the construction, the PMOS transistor indicated by reference numeral 24 is a pull-up transistor whose switching operation is determined according to the voltage level of a connecting node 38. The PMOS transistors indicated by reference numerals 26 and 28 are commonly connected in their gate and drain terminals, which are each used as resistances. A PMOS transistor indicated by reference numeral 32 has a gate terminal and a drain terminal connected commonly to the ground voltage Vss, the PMOS transistor being the pull-down transistor. Circuits indicated by reference numerals 34 to 46 are the known differential amplifier circuits and each input a reference voltage Vref and a voltage applied to the connecting node 30. The connecting node 38 connected to the differential amplifier circuits 34, 36, 38, 40, 42, 44 and 46 controls the switching operation of the PMOS transistor 24. Two CMOS inverters 48 and 50 which are serially connected to each other, are coupled to the connecting node 38. The power voltage sensing signal VccDet is outputted through the CMOS inverter 50. The two CMOS inverters 48 and 50 are operated as driving circuits. The power voltage sensing signal generator shown in FIG. 3 compares the reference signal Vref with the voltage applied to the connecting node 30 and determines the logic of the signal VccDet with the comparison results and thereby provides it to the input buffer shown in FIG. 2. The reference signal Vref is minimally affected by temperature and process situation and is maintained at the stable voltage level. The reference voltage Vref is the same as an output signal of the reference voltage generator disclosed in "Variable Vcc Design Techniques for Battery Operated DRAMs", on pages 110 to 111 of a Paper "Symposium on VLS Circuits Digest of Technical Papers" published 1992. Further, the reference voltage Vref constantly maintains Vgs of the transistors regardless of the variation of the power voltage Vcc and reduces the unnecessary current consumption and then minimizes noise. Furthermore, the reference voltage has characteristic of maintaining a constant gap with respect to the variations of the external power and temperature.

Figure 4:
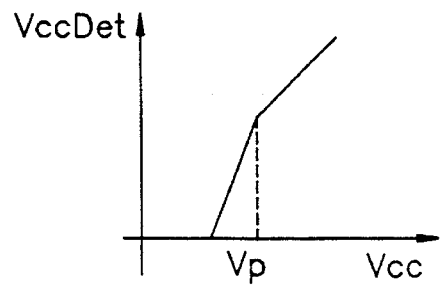
FIG. 4 is a waveform showing a voltage level of a power voltage sensing; signal VccDet corresponding to the voltage level of a power voltage Vcc.

FIG. 4 is a waveform showing the voltage level of the power voltage sensing signal VccDet corresponding to the voltage level of the power voltage Vcc according to the construction of FIG. 3. As shown in FIG. 3, in a point corresponding to the specific voltage level Vp of the voltage levels of the power voltage Vcc, the power voltage sensing signal VccDet rises to the logic "high" level. The position of the specific voltage level Vp can be somewhat changed by the designer according to the adjustment of the size of the transistor.

In case that the power voltage is 5 volts or 3.3 volts, the operational characteristic is as follows. First, in case that the power voltage is 5 volts, the voltage level supplied to a connecting node 30 from the power voltage Vcc, i.e., the voltage level charged to the connecting node 30, is higher than the reference signal Vref. Then, the amount of current flowing into a channel of the NMOS transistor 44 is more than that of a channel of the NMOS transistor 42. Accordingly, the connecting node 40 becomes the logic "low" level and the PMOS transistors 34 and 36 are each turned on. Thereby, the connecting node 38 is discharged to the logic "high" level and thus the power voltage sensing signal VccDet set to the logic "high" level is outputted through the inverters 48 and 50. The PMOS transistor 22 of the input buffer of FIG. 2 supplied with the power voltage sensing signal VccDet set to the logic "high" level is turned off, so that only the PMOS transistor 16 functions as a path for providing the power voltage Vcc to the connecting node 18. Next, in case that the power voltage is 3.3 volts, the voltage level supplied to the connecting node 30 from the power voltage Vcc, i.e., the voltage level charged to the connecting node 30, is lower than the reference signal Vref. Then, the amount of current flowing into a channel of the NMOS transistor 42 is more than that of a channel of the NMOS transistor 44. Accordingly, the connecting node 40 becomes the logic "high" level and the PMOS transistors 34 and 36 are each turned off. Thereby, the connecting node 38 is discharged to the logic "low" level and thus the power voltage sensing signal VccDet set to the logic "low" level is outputted through the inverters 48 and 50. The PMOS transistor 22 of the input buffer of FIG. 2 supplied with the power voltage sensing signal VccDet set to the logic "low" level is turned on, and then functions, together with the PMOS transistor 16, as a path for providing the power voltage Vcc to the connecting node 18. Therefore, in response to the power voltage sensing signal VccDet, the input buffer can correspond to the variation of the operating voltage without changing the mask by using a single mask, since the input buffer has the PMOS transistor 22 which is the driving transistor.

Figure 5:
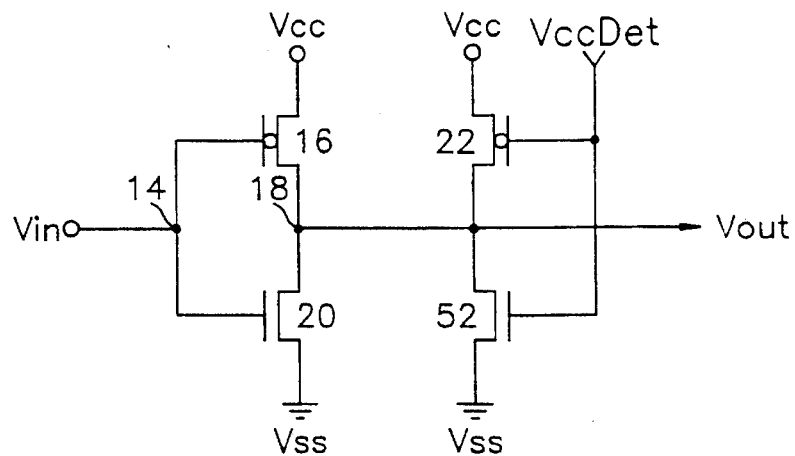
FIG. 5 is a circuit view showing a second embodiment of an input buffer circuit according to the present invention.

FIG. 5 is circuit view showing the second embodiment of the input buffer circuit according to the present invention. The input buffer circuit of FIG.5, compared with that of FIG. 2, further comprises an NMOS transistor 52 which gate-inputs the power voltage sensing signal VccDet and has the current path formed between the outputting node 18 and the ground voltage Vss. According to the construction of FIG. 5, in case that the power voltage Vcc is 5 volts, when the input signal Vin is inputted at the logic "high" level, the voltage level charged to the outputting node 18 is discharged at high speed.

Figure 6:
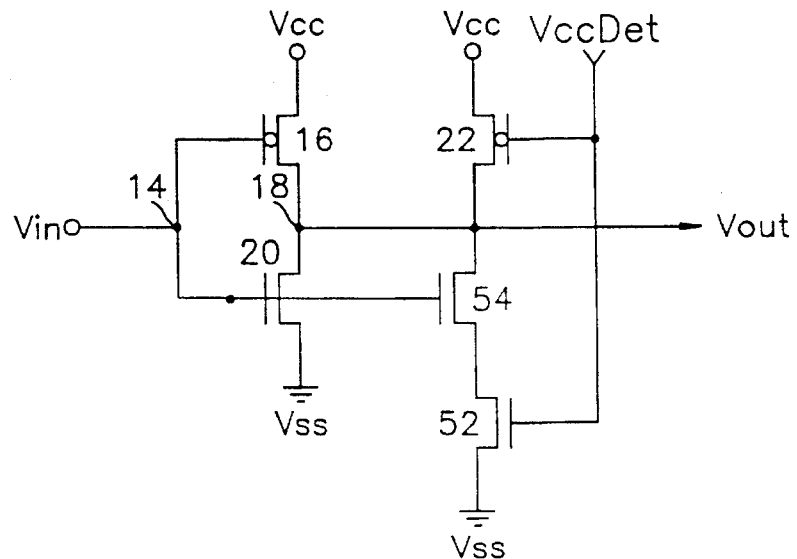
FIG. 6 is a circuit view showing a third embodiment of an input buffer circuit according to the present invention.

FIG. 6 is circuit view showing the third embodiment of the input buffer circuit according to the present invention. The input buffer circuit of FIG. 6 further comprises, in addition to the construction of FIG. 5, an NMOS transistor 54 which gate-inputs the input signal Vin and has the current path formed between the outputting node 18 and a drain terminal of the NMOS transistor 52. According to the construction of FIG. 6, in case that the power voltage Vcc is 5 volts, when the input signal Vin is inputted at the logic "low" level, the power voltage Vcc charged to the outputting node 18 is charged at high speed.

Figure 7:
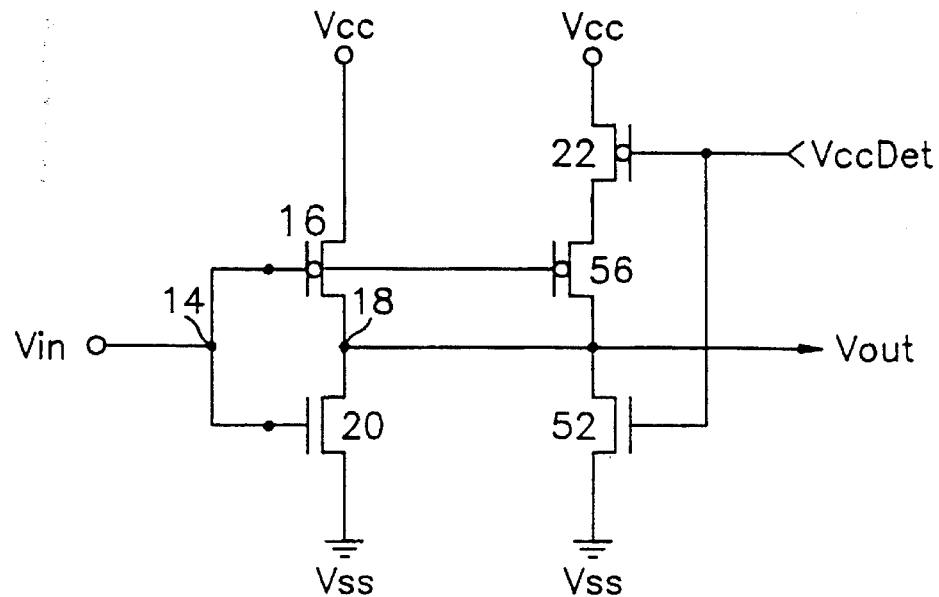
FIG. 7 is a circuit view showing a fourth embodiment of an input buffer circuit according to the present invention.

FIG. 7 is circuit view showing the fourth embodiment of the input buffer circuit according to the present invention. The input buffer circuit of FIG. 7 further comprises, in addition to the construction of FIG. 5, an PMOS transistor 56 which gate-inputs the input signal Vin and has the current path formed between the outputting node 18 and a drain terminal of the PMOS transistor 22. According to the construction of FIG. 7, in case that the power voltage Vcc is 3.3 volts, when the input signal Vin is inputted at the logic "high" level, the power voltage Vcc is prevented from being unnecessarily charged to the outputting node 18.

Figure 8:
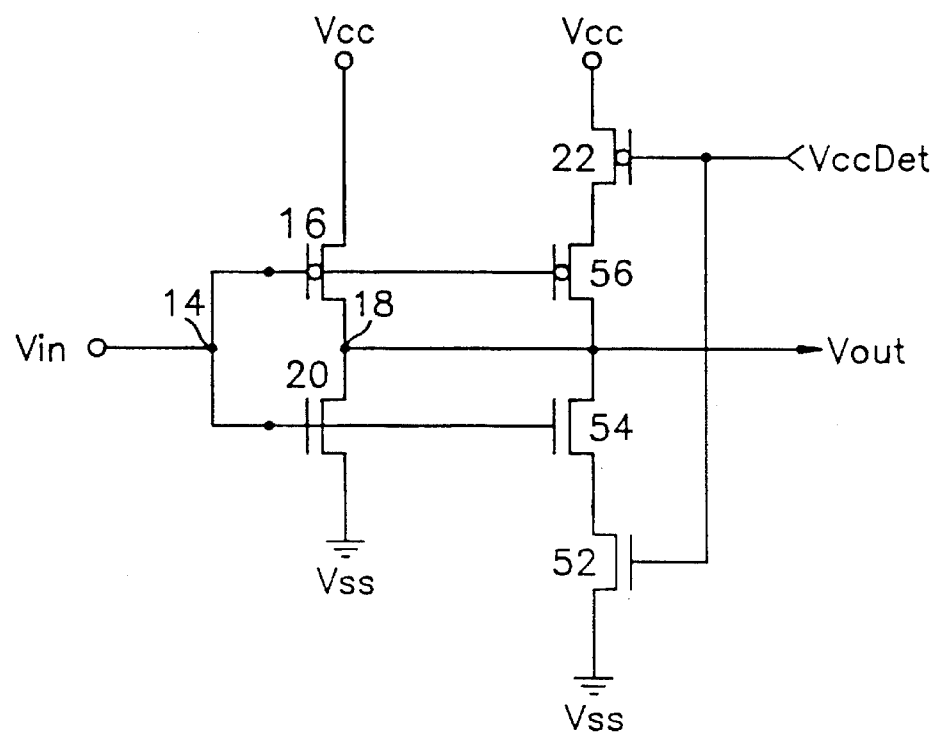
FIG. 8 is a circuit view showing a fifth embodiment of an input buffer circuit according to the present invention.

FIG. 8 is circuit view showing the fifth embodiment of the input buffer circuit according to the present invention. The input buffer circuit of FIG. 8 comprises, in addition to the construction of FIG. 5, circuits having merits of FIGS. 6 and 7. In construction of FIG. 8, the PMOS transistor 22 gate-inputs the power voltage sensing signal VccDet between the power voltage Vcc and the ground voltage Vss. The PMOS transistor 56 gate-inputs the input signal Vin. The NMOS transistor 54 gate-inputs the input signal Vin. Each of the current paths of the NMOS transistor 52 gate-inputting the power voltage sensing signal VccDet, is serially connected to each other. The drain terminal of the PMOS transistor 56 and the drain terminal of the NMOS transistor 54 are each connected to the outputting node 18. Such a construction enables the circuits stably operate regardless of the signal level of the input signal Vin and a kind of operating voltage.

In the embodiment of the input buffer circuit shown in FIGS. 9 to 11 described hereinafter, a chip selection signal CS and the power voltage sensing signal VccDet are supplied as a control signal to the input buffer circuit formed between the power voltage Vcc and the ground voltage Vss. This indicates that FIG. 8 is a NOR gate circuit which inputs the input signal, the chip selection signal CS and the power voltage sensing signal VccDet, respectively.

Figure 9:
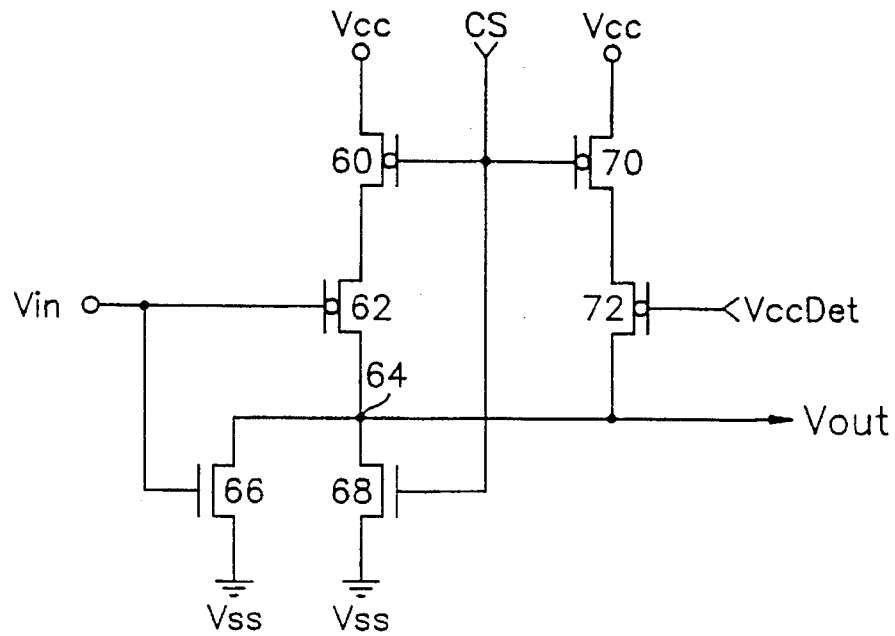
FIG. 9 is a circuit view showing a sixth embodiment of an input buffer circuit according to the present invention.

FIG. 9 is circuit view showing the sixth embodiment of the input buffer circuit according to the present invention. FIG. 9 is comprised of a PMOS transistor 60 whose source terminal is connected to the power voltage Vcc and whose gate terminal is connected to the chip selection signal CS, a PMOS transistor 62 having the current path formed between the PMOS transistor 60 and an outputting node 64 and gate-inputting the input signal Vin, an NMOS transistor 66 having the current path formed between the outputting node 64 and the ground voltage Vss and gate-inputting the input signal Vin, an NMOS transistor 68 having the current path formed between the outputting node 64 and the ground voltage Vss and gate-inputting the chip selection signal CS, a PMOS transistor 70 whose source terminal is connected to the power voltage Vcc and whose gate terminal is connected to the chip selection signal CS, and a PMOS transistor 72 having the current path formed between the PMOS transistor 70 and the outputting node 64 and gate-inputting the power voltage sensing signal VccDet. FIG. 9 implements a NOR circuit in its construction. In the construction of FIG. 9, it is possible to reduce the current consumption during a stand-by state because the input buffer circuit is controlled by the chip selection signal CS. The chip selection signal is only active in an operation for selecting the chip. The output signal Vout with respect to each of input levels of the input signal Vin and the chip selection signal CS, except the power voltage sensing signal VccDet whose logic level is determined according to the operating voltage, is represented as the following <Table 1>. In the following Table <1>, the logic "high" level is represented as "H" and "low" level as "L", receptively.

TABLE 1

| Vin | CS | VccDet | Vout |
|---|---|---|---|
| L | L | L(Vcc = 3.3 volts) | H |
| L | L | H(Vcc = 5 volts) | H |
| L | H | L | L |
| L | H | H | L |
| H | L | L | L |
| H | L | H | L |
| H | H | L | L |
| H | H | H | L |

Figure 10:
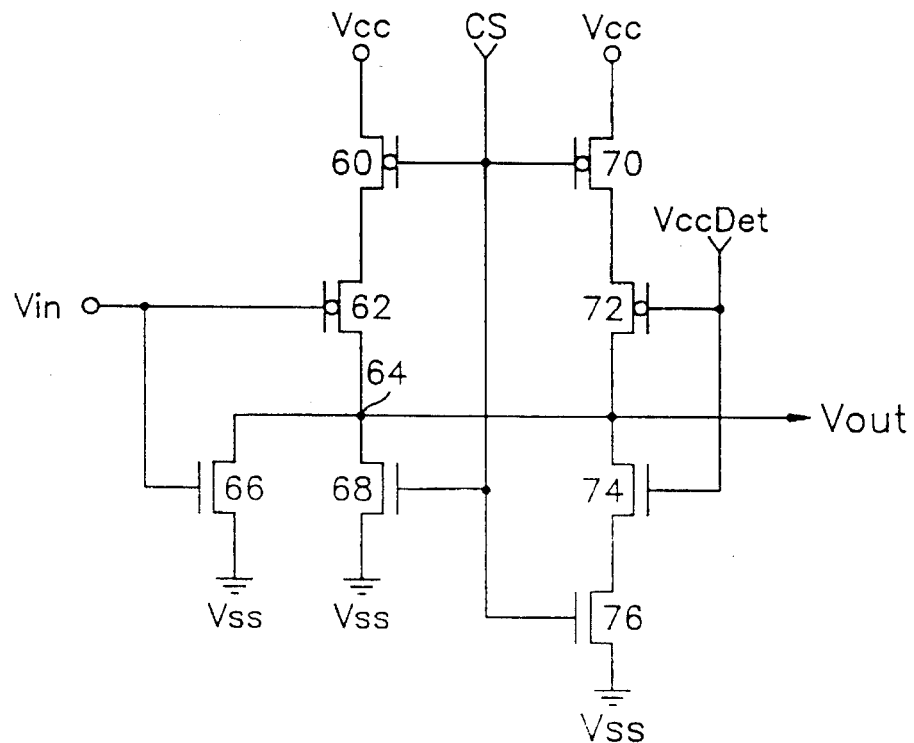
FIG. 10 is a circuit view showing a seventh embodiment of an input buffer circuit according to the present invention.

FIG. 10 is a circuit view showing the seventh embodiment of the input buffer circuit according to the present invention. The input buffer circuit of FIG. 10 further comprises, in addition to the construction of FIG. 9, an NMOS transistor 74 gate-inputting the power voltage sensing signal VccDet and having a drain terminal connected to the outputting node 64 and an NMOS transistor 76 gate-inputting the chip selection signal CS and having the current path formed between a source terminal of the NMOS transistor 74 and the ground voltage Vss.

Figure 11:
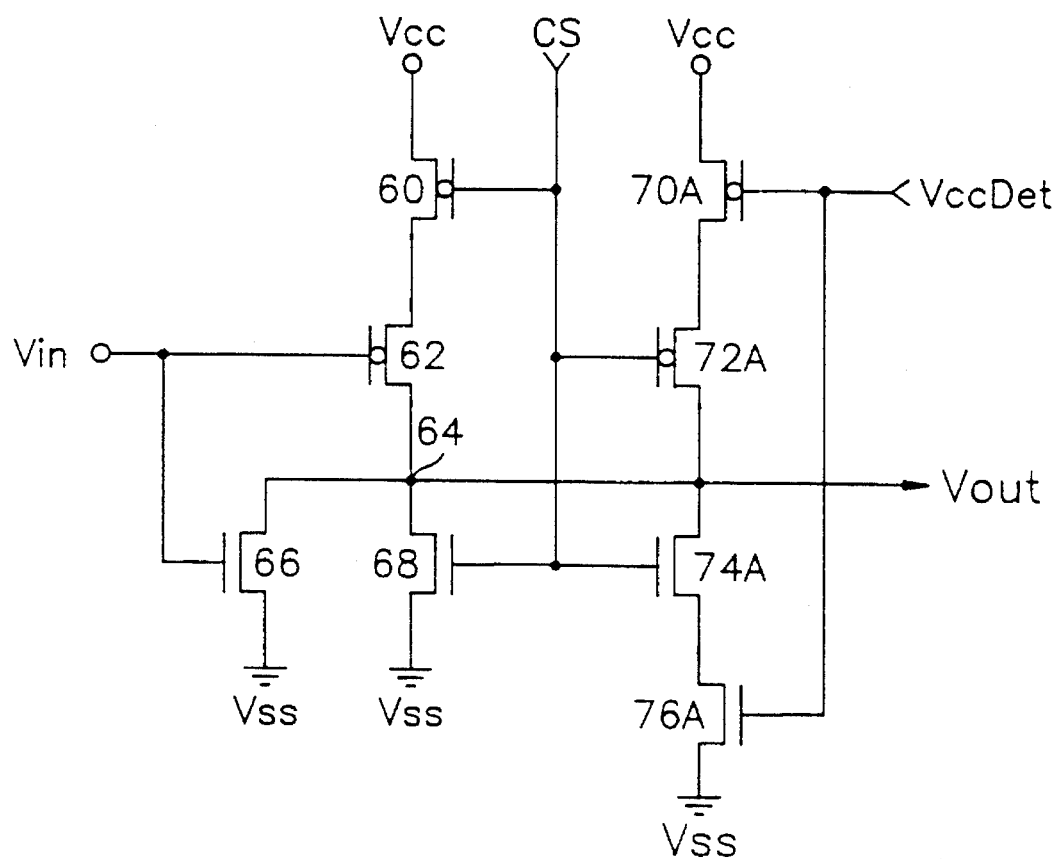
FIG. 11 is a circuit view showing an eighth embodiment of an input buffer circuit according to the present invention.

FIG. 11 is a circuit view showing the eighth embodiment of the input buffer circuit according to the present invention.

In the construction of the input buffer circuit of FIG. 11, the PMOS transistors 70A and 72A change each other and then gate-input the chip selection signal CS and the power voltage sensing signal VCCDET. Further, the NMOS transistors 74A and 76A change each other and then gate-input the chip selection signal CS and the power voltage sensing signal VccDet.

The input buffer circuits of the present invention shown in FIGS. 2 to 11 are preferred embodiments based on the spirit of the present invention. It will be understood by those skilled in the art that foregoing and other change in form and details may be made without departing from the spirit and scope of the present invention.

As stated above, the input buffer circuit of the present invention comprises the driving transistor whose switching operation is determined according to the control of the power voltage sensing signal VccDet to sense the voltage level of the power voltage, so that there arises one efficiency in that there is no need to change the mask, even if, the operating voltage is varied. Further, since the input buffer circuit of the present invention can correspond to a plurality of operating voltages by using a single mask, there aries another efficiency capable of reducing production cost and production time.

What is claimed is:

1. A semiconductor integrated circuit connectable to an external power source having two power voltage levels comprising:

a power voltage terminal connectable to said external power source, a power voltage sensing signal generator coupled to said power voltage terminal, said signal generator detecting one of said power voltage levels of said external power source and generating a power voltage sensing signal having a "high" and "low" state corresponding to said detected level, and an input buffer circuit coupled to said power voltage sensing signal generator, said input buffer circuit performing an input operation of converting an external signal into an internal signal, said input buffer circuit using said power voltage sensing signal to accelerate said input operation in dependence upon said power voltage level.

2. A semiconductor integrated circuit as claimed in claim 1, wherein said power voltage sensing signal generator comprises a differential amplifier circuit, said differential amplifier circuit having a first input connectable to a reference signal having a stable voltage level and having a second input serially connectable to said power voltage terminal through a predetermined resistance.

3. A semiconductor integrated circuit as claimed in claim 2, wherein said input buffer circuit comprises:

a pull-up transistor controlled by said external signal and having a first current path formed between said power voltage and an outputting node;

a pull-down transistor controlled by said external signal and having a second current path formed between a ground voltage and said outputting node; and a driving transistor controlled by said power voltage sensing signal and having a third current path formed between said power voltage terminal and said outputting node.

4. An input buffer circuit of a semiconductor integrated circuit, said input buffer circuit capable of operating with two different operating voltages and comprising:

a first pull-up transistor controlled by an input signal supplied from an outside source and having a first current path formed between a power voltage and an outputting node;

a pull-down transistor controlled by said input signal and having a second current path formed between a ground voltage and said outputting node; and a second pull-up transistor controlled by a power voltage sensing signal whose logic level is determined according to which of said operating voltages is used by said input buffer circuit and having a third current path formed between said power voltage and said outputting node.

5. An input buffer circuit as claimed in claim 4, wherein said semiconductor integrated circuit further comprises a differential amplifier circuit and a reference voltage generator, said differential amplifier circuit having as inputs said power voltage and a reference voltage output from said reference voltage generator, said differential amplifier circuit outputting said power voltage sensing signal to said input buffer circuit.

6. An input buffer circuit as claimed in claim 5, wherein said power voltage sensing signal is inputted at a "high" level in case that said operating voltage is 5 volts and it is outputted at a "low" level in case that said operating voltage is 3.3 volts.

7. An input buffer circuit as claimed in claim 4, wherein said input buffer circuit further comprises a driving transistor having a fourth current path formed between said outputting node and said ground voltage and controlled by said power voltage sensing signal.

8. An input buffer circuit of a semiconductor integrated circuit, said input buffer circuit capable of operating with two different operating voltages and comprising:

a pull-up transistor controlled by an input signal supplied from an outside source and having a first current path formed between a power voltage and an outputting node;

a pull-down transistor controlled by said input signal and having a second current path formed between a ground voltage and said outputting node;

a first PMOS transistor controlled by a power voltage sensing signal whose logic level is determined according to which of said operating voltages is used by said input buffer circuit and having a source terminal connected to said power voltage;

a second PMOS transistor controlled by said input signal and having a first channel formed between a drain terminal of said first PMOS transistor and said outputting node;

a first NMOS transistor controlled by said input signal and having a drain terminal connected to said outputting node; and a second NMOS transistor controlled by said power voltage sensing signal and having a second channel formed between a source terminal of said first NMOS transistor and said ground voltage.

9. An input buffer circuit as claimed in claim 8, wherein said semiconductor integrated circuit further comprises a differential amplifier circuit and a reference voltage generator, said differential amplifier circuit having as inputs said power voltage and a reference voltage output from said reference voltage generator, said differential amplifier circuit outputting said power voltage sensing signal to said input buffer circuit.

10. An input buffer circuit as claimed in claim 8, wherein said power voltage sensing signal is inputted at a "high" level in case that said operating voltage is 5 volts and it is outputted at a "low" level in case that said operating voltage is 3.3 volts.

11. An input buffer circuit of a semiconductor integrated circuit, said input buffer circuit capable of operating with two different operating voltages and comprising:

a first PMOS transistor having a source terminal connected to a power voltage and controlled by a chip selection signal which is supplied from an outside source and then is converted into an internal signal;

a second PMOS transistor controlled by an input signal supplied from an outside source and having a first channel formed between a drain terminal of said first PMOS transistor and an outputting node;

a third PMOS transistor controlled by said chip selection signal and having a source terminal connected to said power voltage;

a fourth PMOS transistor controlled by a power voltage sensing signal signal whose logic level is determined according to which of said operating voltages is used by said input buffer circuit and having a second channel formed between a drain terminal of said third PMOS transistor and said outputting node;

a first NMOS transistor controlled by said input signal and having a third channel formed between said ground voltage and said outputting node; and a second NMOS transistor controlled by said chip selection signal and having a fourth channel formed between said outputting node and said ground voltage.

12. An input buffer circuit as claimed in claim 11, wherein said semiconductor integrated circuit further comprises a differential amplifier circuit and a reference voltage generator, said differential amplifier circuit having as inputs said power voltage and a reference voltage output from said reference voltage generator, said differential amplifier circuit outputting said power voltage sensing signal to said input buffer circuit.

13. An input buffer circuit as claimed in claim 12, wherein said power voltage sensing signal is inputted at a "high" level in case that said operating voltage is 5 volts and it is outputted at a "low" level in case that said operating voltage is 3.3 volts.

14. An input buffer circuit as claimed in claim 11, wherein said input buffer circuit further comprises a third NMOS transistor controlled by said power voltage sensing signal and having a drain terminal connected to said outputting node and a fourth NMOS transistor controlled by said chip selection signal and having a fifth channel formed between a source terminal of said third NMOS transistor and said ground voltage.

15. An input buffer circuit of a semiconductor integrated circuit, said input buffer circuit capable of operating with two different operating voltages and comprising:

a first PMOS transistor having a source terminal connected to a power voltage and controlled by a chip selection signal which is supplied from an outside source and then is converted into an internal signal;

a second PMOS transistor controlled by an input signal supplied from an outside source and having a first channel formed between a drain terminal of said first PMOS transistor and an outputting node;

a third PMOS transistor controlled by a power voltage sensing signal whose logic level is determined according to which of said operating voltages is used by said input buffer circuit and having a source terminal connected to said power voltage;

a fourth PMOS transistor controlled by said chip selection signal and having a second channel formed between a drain terminal of said third PMOS transistor and said outputting node;

a first NMOS transistor controlled by said input signal and having a third channel formed between said ground voltage and said outputting node;

a second NMOS transistor controlled by said chip selection signal and having a fourth channel formed between said outputting node and said ground voltage;

a third NMOS transistor controlled by said chip selection signal and having a drain terminal connected to said outputting node; and a fourth NMOS transistor controlled by said power voltage sensing signal and having a fifth channel formed between a source terminal of said third NMOS transistor and said ground voltage.

16. An input buffer circuit as claimed in claim 15, wherein said semiconductor integrated circuit further comprises a differential amplifier circuit and a reference voltage generator, said differential amplifier circuit having as inputs said power voltage and a reference voltage output from said reference voltage generator, said differential amplifier circuit outputting said power voltage sensing signal to said input buffer circuit.

17. An input buffer circuit as claimed in claim 16, wherein said power voltage sensing signal is inputted at a "high" level in case that said operating voltage is 5 volts and it is outputted at a "low" level in case that said operating voltage is 3.3 volts.

* * * * *